(12) United States Patent
Park et al.

(10) Patent No.: US 8,430,961 B2
(45) Date of Patent: Apr. 30, 2013

(54) SOURCE GAS FLOW PATH CONTROL IN PECVD SYSTEM TO CONTROL A BY-PRODUCT FILM DEPOSITION ON INSIDE CHAMBER

(75) Inventors: Beom Soo Park, San Jose, CA (US); Young Jin Choi, Santa Clara, CA (US); Robin L. Tiner, Santa Cruz, CA (US); Sam H. Kim, San Ramon, CA (US); Soo Young Choi, Fremont, CA (US); John M. White, Hayward, CA (US); Dong-Kil Yim, Seongnam-si (KR)

(73) Assignee: Applied Materials, Inc., Santa Clara, CA (US)

( * ) Notice: Subject to any disclaimer, the term of this patent is extended or adjusted under 35 U.S.C. 154(b) by 1253 days.

(21) Appl. No.: 12/205,363

(22) Filed: Sep. 5, 2008

(65) Prior Publication Data
US 2009/0064934 A1    Mar. 12, 2009

Related U.S. Application Data

(60) Provisional application No. 60/970,760, filed on Sep. 7, 2007.

(51) Int. Cl.
*C23C 16/00* (2006.01)
*H01L 21/306* (2006.01)

(52) U.S. Cl.
USPC .............. 118/715; 156/345.31; 156/345.32

(58) Field of Classification Search .......... 118/715; 156/345.3, 345.31, 345.32
See application file for complete search history.

(56) References Cited

U.S. PATENT DOCUMENTS

| 5,024,748 | A | | 6/1991 | Fujimura |
| 5,443,648 | A | * | 8/1995 | Ohkase .................... 118/724 |
| 5,603,816 | A | | 2/1997 | Demaray et al. |
| 5,820,723 | A | | 10/1998 | Benjamin et al. |
| 6,099,651 | A | | 8/2000 | Sajoto et al. |
| 6,192,827 | B1 | * | 2/2001 | Welch et al. ............ 118/723 E |
| 6,325,856 | B1 | | 12/2001 | Schertler et al. |
| 6,364,954 | B2 | * | 4/2002 | Umotoy et al. ............. 118/715 |
| 6,647,918 | B1 | * | 11/2003 | Welch et al. ............ 118/723 R |
| 6,663,714 | B2 | | 12/2003 | Mizuno et al. |
| 6,716,302 | B2 | * | 4/2004 | Carducci et al. ......... 156/345.47 |
| 6,818,067 | B2 | * | 11/2004 | Doering et al. .............. 118/715 |

(Continued)

FOREIGN PATENT DOCUMENTS

| CN | 1610768 | 4/2005 |
| EP | 1801846 | 6/2007 |

(Continued)

OTHER PUBLICATIONS

Notice to File a Response for Korean Patent Application No. 10-2008-0082184 dated Jul. 26, 2010.

*Primary Examiner* — Jeffrie R Lund
(74) *Attorney, Agent, or Firm* — Patterson & Sheridan, LLP

(57) ABSTRACT

The present invention generally comprises a method and an apparatus for guiding the flow of processing gases away from chamber walls and slit valve opening. By controlling the flow path of the process gases within a processing chamber, undesirable deposition upon chamber walls and within slit valve openings may be reduced. By reducing deposition in slit valve openings, flaking may be reduced. By reducing deposition on chamber walls, the time between chamber cleaning may be increased. Thus, guiding the flow of processing gases within the processing chamber may increase substrate throughput.

20 Claims, 7 Drawing Sheets

U.S. PATENT DOCUMENTS

| | | |
|---|---|---|
| 6,866,746 B2 | 3/2005 | Lei et al. |
| 7,048,837 B2 | 5/2006 | Somekh et al. |
| 7,147,719 B2 * | 12/2006 | Welch et al. .................. 118/715 |
| 7,229,666 B2 * | 6/2007 | Mardian et al. ............ 427/248.1 |
| 7,981,812 B2 * | 7/2011 | Chiang et al. ................ 438/780 |
| 8,343,307 B2 * | 1/2013 | Huston .................... 156/345.34 |
| 2002/0121342 A1* | 9/2002 | Nguyen et al. .......... 156/345.33 |
| 2002/0189940 A1 | 12/2002 | Tsai et al. |
| 2003/0010451 A1* | 1/2003 | Tzu et al. ................. 156/345.33 |
| 2003/0019428 A1* | 1/2003 | Ku et al. ...................... 118/715 |
| 2003/0079686 A1 | 5/2003 | Chen et al. |
| 2003/0198754 A1* | 10/2003 | Xi et al. ........................ 427/576 |
| 2004/0069225 A1* | 4/2004 | Fairbairn et al. .............. 118/715 |
| 2004/0083978 A1* | 5/2004 | Welch et al. .................. 118/733 |
| 2004/0094402 A1 | 5/2004 | Gopalraja et al. |
| 2004/0144311 A1* | 7/2004 | Chen et al. .................... 118/715 |
| 2004/0245089 A1* | 12/2004 | Lawson ...................... 204/192.1 |
| 2004/0245097 A1* | 12/2004 | Lawson et al. ........... 204/298.01 |
| 2005/0196971 A1 | 9/2005 | Sen et al. |
| 2005/0199491 A1 | 9/2005 | Gung et al. |
| 2005/0271812 A1* | 12/2005 | Myo et al. .................. 427/248.1 |
| 2006/0039537 A1 | 2/2006 | Strobel |
| 2006/0207508 A1 | 9/2006 | Leung |
| 2007/0044714 A1* | 3/2007 | White ........................... 118/715 |
| 2007/0178810 A1 | 8/2007 | Choi et al. |
| 2008/0134974 A1* | 6/2008 | Takahashi et al. ............ 118/715 |
| 2008/0188033 A1 | 8/2008 | Choi et al. |
| 2008/0202416 A1* | 8/2008 | Provencher et al. .......... 118/715 |
| 2009/0064934 A1* | 3/2009 | Park et al. ................. 118/723 R |
| 2009/0095334 A1* | 4/2009 | Huston ........................ 134/105 |
| 2009/0095621 A1* | 4/2009 | Kao et al. ................. 204/298.32 |
| 2009/0107955 A1* | 4/2009 | Tiner et al. ...................... 216/67 |
| 2009/0111280 A1* | 4/2009 | Kao et al. ...................... 438/761 |
| 2011/0011338 A1* | 1/2011 | Chuc et al. .................... 118/715 |
| 2012/0196437 A1* | 8/2012 | Ishizaka et al. ............... 438/653 |
| 2012/0267346 A1* | 10/2012 | Kao et al. .................. 219/121.52 |
| 2012/0291709 A1* | 11/2012 | Smith et al. ................... 118/725 |

FOREIGN PATENT DOCUMENTS

| | | |
|---|---|---|
| JP | 1183717 | 7/1989 |
| JP | 3516305 | 8/1994 |
| JP | 1996-253857 | 1/1996 |
| JP | 1997-111450 | 4/1997 |
| JP | 1997-170077 | 6/1997 |
| JP | 1997-265659 | 10/1997 |
| JP | 10-116826 | 5/1998 |
| JP | 2000-101500 | 4/2000 |
| JP | 2000-183429 | 6/2000 |
| JP | 2002-161960 | 6/2002 |
| JP | 2004-002971 | 1/2004 |
| JP | 2005-303308 | 10/2005 |
| JP | 2006-290465 | 10/2006 |
| KR | 10-2000-0067636 | 11/2000 |
| KR | 10-2002-0037612 | 7/2004 |
| KR | 20070055075 A | 5/2007 |
| WO | WO 97/34315 | 9/1997 |
| WO | WO 97/36177 | 10/1997 |
| WO | WO 97/39472 | 10/1997 |
| WO | WO 98/28460 | 7/1998 |
| WO | WO 98/32154 | 7/1998 |
| WO | WO 99/14391 | 3/1999 |
| WO | WO 00/48779 | 8/2000 |
| WO | WO 00/63460 | 10/2000 |
| WO | WO 00/66806 | 11/2000 |
| WO | WO 00/70606 | 11/2000 |
| WO | WO 00/71774 | 11/2000 |
| WO | WO 01/04379 | 1/2001 |
| WO | WO 03/065085 | 8/2003 |
| WO | WO 03/097896 | 11/2003 |
| WO | WO 2004/038774 | 5/2004 |
| WO | WO 2004/046416 | 6/2004 |
| WO | WO 2004/059030 | 7/2004 |
| WO | WO 2004/075225 | 9/2004 |
| WO | WO 2004/093161 | 10/2004 |
| WO | WO 2005/068382 | 7/2005 |
| WO | WO 2005/073433 | 8/2005 |

* cited by examiner

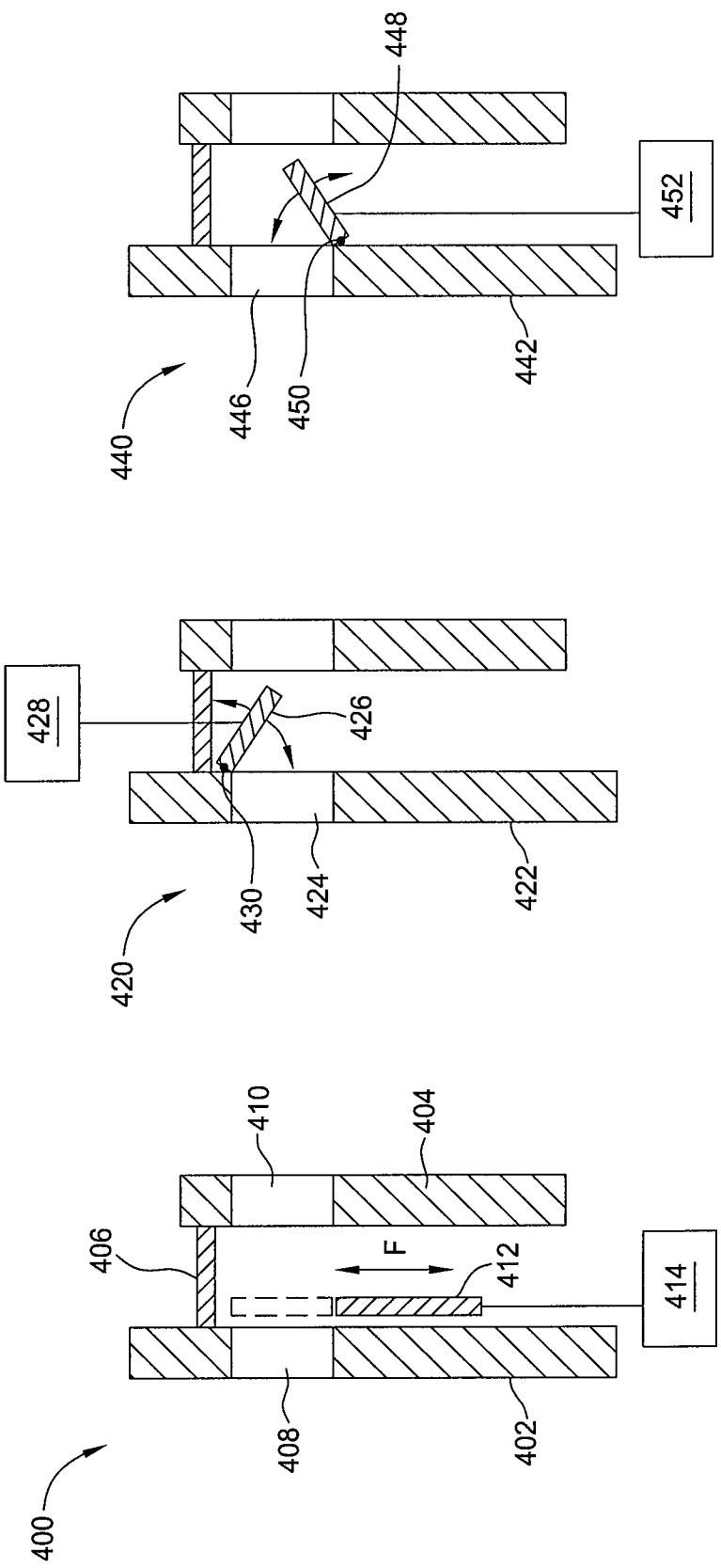

SOURCE GAS FLOW PATH CONTROL IN PECVD SYSTEM TO CONTROL A BY-PRODUCT FILM DEPOSITION ON INSIDE CHAMBER

CROSS-REFERENCE TO RELATED APPLICATIONS

This application claims benefit of U.S. Provisional Patent Application Ser. No. 60/970,760 (APPM/012193L), filed Sep. 7, 2007, which is herein incorporated by reference.

BACKGROUND OF THE INVENTION

1. Field of the Invention

Embodiments of the present invention generally relate to an apparatus for controlling the flow of process gases within a process chamber.

2. Description of the Related Art

When processing substrates in a vacuum, a vacuum pump is used to evacuate the processing chamber to the appropriate processing pressure. In some cases, the vacuum pump will continually evacuate processing gases introduced into the processing chamber to maintain a desired processing pressure. The vacuum pump will pull the processing gases through the processing chamber to the vacuum pump port leading to the vacuum pump.

Processing gases, such as deposition gases, are introduced into the processing chamber and, during processing, may lead to deposition on exposed chamber components. Deposition on undesired chamber components may lead to component failure or substrate contamination during processing. When a component fails, the component will need to either be cleaned or replaced. In either case, the processing chamber will need to be shut down to access the component, which leads to a decrease in substrate throughput.

Therefore, there is a need in the art for a processing chamber designed to reduce chamber component failure.

SUMMARY OF THE INVENTION

The present invention generally comprises a method and an apparatus for guiding the flow of processing gases away from chamber walls and slit valve opening. By controlling the flow path of the process gases within a processing chamber, undesirable deposition upon chamber walls and within slit valve openings may be reduced. By reducing deposition in slit valve openings, flaking may be reduced. By reducing deposition on chamber walls, the time between chamber cleaning may be increased. Thus, guiding the flow of processing gases within the processing chamber may increase substrate throughput.

In one embodiment, an apparatus includes a chamber body having a slit valve opening through a first sidewall, one or more flow guiders coupled with one or more sidewalls of the chamber body, one or more flow blockers coupled to and extending from the first sidewall above the slit valve opening, and a door movable between a position covering the slit valve opening and a second position. The one or more flow blockers are coupled to a flow guider having an opening therethrough that substantially aligns with the slit valve opening.

In another embodiment, an apparatus includes a plurality of flow guiders extending from processing chamber walls to enclose a processing area between a susceptor and a gas distribution showerhead. A first of the plurality of flow guiders have an opening therethrough to permit a substrate to pass therethrough. The apparatus also includes one or more flow blockers coupled with the first flow guider and extending away from the processing area and one or more doors movable from a position blocking the opening to a position clear of the opening. The first flow guider is disposed between the one or more doors and the processing area.

In another embodiment, an apparatus includes a chamber body having a plurality of sidewalls with an opening formed through a first sidewall. The apparatus also includes a flow guider coupled with the first sidewall. The flow guider has an opening therethrough that is substantially aligned with the opening in the first sidewall. The apparatus further includes a flow blocker coupled between the first sidewall and the flow guider over the slit valve opening. The flow blocker spans a length greater than the slit valve opening. The apparatus also includes a susceptor disposed in the chamber body such that an outer surface of the flow guider is aligned with a side of the susceptor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4A is a partial sectional view of a door assembly for blocking a slit valve opening according to one embodiment of the invention.

FIG. 4B is a partial sectional view of a door assembly for blocking a slit valve opening according to another embodiment of the invention.

FIG. 4C is a partial sectional view of a door assembly for blocking a slit valve opening according to another embodiment of the invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a method and an apparatus for guiding the flow of processing gases away from chamber walls and slit valve opening. By controlling the flow path of the process gases within a processing chamber, undesirable deposition upon chamber walls and within slit valve openings may be reduced. By reducing deposition in slit valve openings, flaking may be reduced. By reducing deposition on chamber walls, the time between chamber cleaning may be increased. Thus, guiding the flow of processing gases within the processing chamber may increase substrate throughput.

The invention will be illustratively described below in relation to a PECVD chamber available from AKT America, Inc., a subsidiary of Applied Materials, Inc., Santa Clara, Calif. It is to be understood that the invention is equally applicable to any chamber that utilizes a processing gas including physical vapor deposition (PVD) chambers. It is also to be understood that the invention described below is equally applicable to PECVD chambers and other chambers sold by other vendors.

Figure 1:
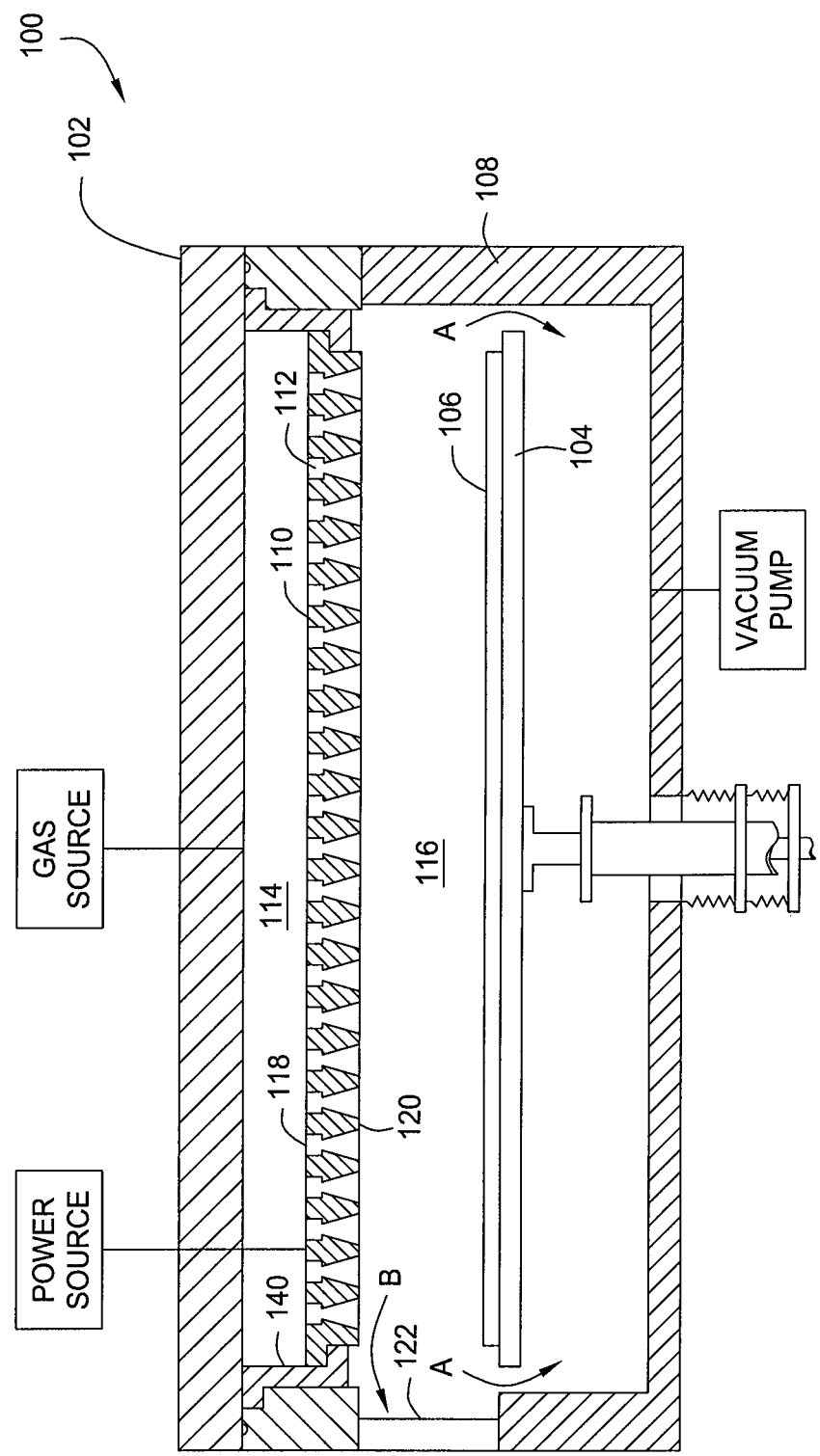
FIG. 1 is a schematic cross sectional view of a plasma enhanced chemical vapor deposition (PECVD) apparatus.

FIG. 1 is a schematic cross sectional view of a PECVD apparatus 100. The apparatus 100 may comprise a susceptor 104 having a substrate 106 thereon. The substrate 106 may be disposed across a processing space 116 from a showerhead 110. The processing space 116 may be bound by the chamber walls 108, showerhead 110, and substrate 106 or susceptor 104. Processing gas may be fed from a gas source through a backing plate 102 where it may be evenly distributed within a plenum 114 adjacent a back surface 118 of the showerhead 110. The processing gas may then travel through gas passages 112 extending from the back surface 118 to the front surface 120 of the showerhead 110. The showerhead 110 may be coupled with a power source that may be used to ignite or maintain a plasma within the processing space 116.

Once in the processing space 116, the processing gas and hence, the plasma, may disperse and come into contact with all exposed surfaces of the processing chamber. The vacuum pump may pull the plasma and the processing gas below the susceptor 104 as shown by arrows "A". Additionally, the plasma may be drawn near the slit valve 122 as shown by arrow "B" and deposit on the slit valve 122. Material deposited on the slit valve 122 may flake off due to the opening and closing of the slit valve 122 during substrate 106 insertion and removal. Additionally, material may deposit in the chamber areas below the susceptor 104 and into the vacuum pump which may affect the lifetime of the vacuum pump and the various connections between the vacuum pump and the apparatus 100.

The processing gas may not be adequately contained to an area near the substrate 106 and thus, may disperse throughout the processing chamber. The processing gas may, due to the size of the processing chamber, not be evenly distributed across the substrate 106 which may lead to uneven processing of the substrate 106.

Figure 2A:
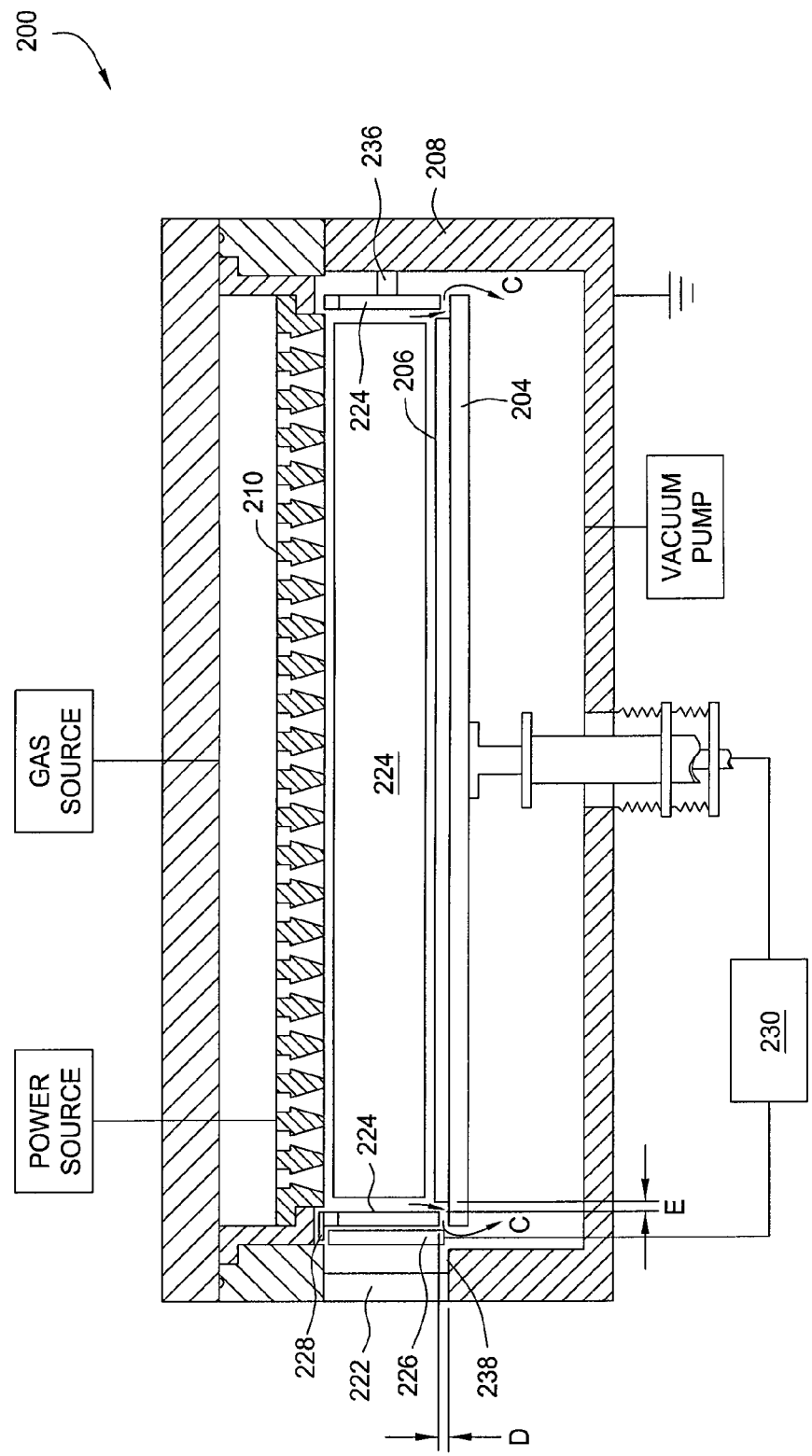
FIG. 2A is a schematic cross sectional view of a PECVD apparatus according to one embodiment of the invention.

In order to reduce unwanted deposition and ensure a more uniform distribution of processing gas to the substrate, one or more flow blockers and/or one or more flow guiders may be used. FIG. 2A is a schematic cross sectional view of a PECVD apparatus 200 according to one embodiment of the invention that utilizes one or more flow blockers 228 and one or more flow guiders 224. The flow guiders 224 may be mounted to the chamber walls 208 by one or more mounts 236 and be disposed between the susceptor 204 and the showerhead 210. The susceptor 204 is shown in the raised position with a substrate 206 disposed thereon.

The flow guiders 224 may have a gap between adjacent flow guiders 224. Process gas, and in some cases, plasma, may flow through the gaps as the vacuum is drawn and maintained. The flow guiders 224 may be grounded to act as an anode during processing. In one embodiment, the height of the flow guiders 224 may be greater than the distance between the substrate 206 and the bottom surface of the showerhead 210 such that the processing gas that comes through the showerhead 210 is substantially concentrated within the processing area and thereby minimizing the amount of plasma and processing gas that may disperse to the chamber walls 208 and other areas where deposition is undesired. Additionally, the outside edge of the flow guiders 224 may be substantially aligned with the outer edge of the susceptor 204 such that the outside surface of the flow guiders 224 and the outside edge of the susceptor 204 lie in substantially the same vertical plane. In another embodiment, the height of the flow guiders 224 may be substantially equal to the distance between the substrate 206 and the bottom surface of the showerhead 210. In another embodiment, the height of the flow guiders 224 may be less than the distance between the substrate 206 and the bottom surface of the showerhead 210.

The flow of the plasma and process gas within the chamber may be substantially confined within the processing area bounded on the sides by the flow guiders 224. By confining as much of the processing gas as possible in between the substrate 206, the flow guiders 224, and the showerhead 210, the plasma uniformity may be increased and consistent deposition may occur on a substrate to substrate basis. Additionally, because the flow guiders 224 may be grounded, the amount of plasma that creeps under the susceptor 204 may be reduced. The space between the susceptor 204 and the flow guiders 224 shown by arrows "D" may be sufficient to pull processing gas therethrough, but sufficiently small to ensure that any plasma that may pass through the gap may be grounded and thus extinguished before flowing below the susceptor 204. The vacuum pump may pull the processing gas through the gaps between the flow guiders 224 and the space between the flow guiders 224 and the susceptor 204 as shown by arrows "C". The flow guiders 224 may be spaced from the susceptor 204. In one embodiment, the flow guiders 236 may be coupled with the susceptor 204 in select locations to permit the processing gas to be pulled through the processing area and between the flow guiders 236 and the susceptor 204. The flow guiders 224 will also be spaced from the substrate 206 when the substrate 206 is in the processing position as shown by arrows "E". In one embodiment, the distance between the susceptor 204 and the flow guiders 224 may be substantially identical to the distance between the substrate 206 and the flow guiders 224 when the substrate 206 is in the processing position.

One or more flow blockers 228 may be disposed over the space between the slit valve opening 222 and the flow guider 224 that is adjacent to the slit valve opening 222 to reduce the amount of plasma and processing gas that may flow into the slit valve opening 222 and deposit on the slit valve or the tunnel 238 leading to the slit valve opening 222. The one or more flow blockers 228 may be disposed between the relative top of the opening of the tunnel 238 and the bottom of the showerhead 228. More generally, when the apparatus is not a PECVD apparatus, the one or more flow blockers 228 may be disposed between the relative top of the tunnel 238 and the top or lid of the processing chamber. For example, in a PVD chamber, the one or more flow blockers 228 may be disposed between the relative top of the opening leading to the slit valve 222 and the target. The flow blockers 228 may reduce the amount of processing gas and plasma that may enter the slit valve opening 222 from the relative top of the opening 222. In one embodiment, the flow blockers 228 extend across the entire length of the sidewall having the slit valve opening 222. In another embodiment, the flow blockers 228 extend across at least the entire length of the slit valve opening 222, but less than the entire length of the sidewall. In another embodiment, flow blockers may extend vertically downward at locations corresponding to the edge of the slit valve opening 222 to define an inverted "U" shaped flow blocker that spans at least the length of the slit valve opening 222 and at least the height of the slit valve opening 222. The area between the slit valve tunnel 238 and the flow guider 224 that is below the slit valve opening 222 may remain open as processing gas and plasma is less likely to flow upwards under the inverted "U" shaped flow blocker.

Figure 2B:
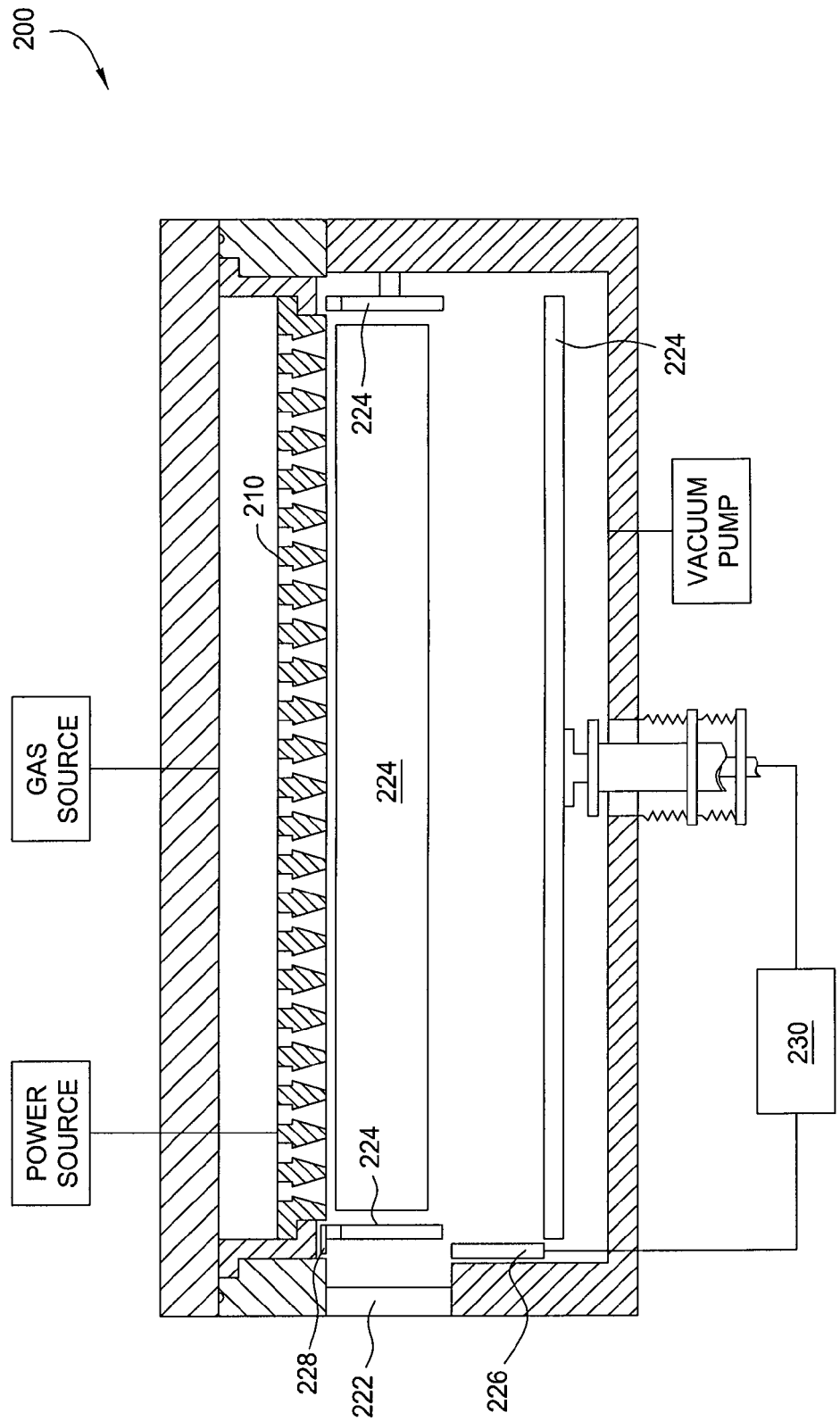
FIG. 2B is a schematic cross sectional view of the PECVD apparatus of FIG. 2A with the susceptor and slit valve liner lowered.
Figure 2C:
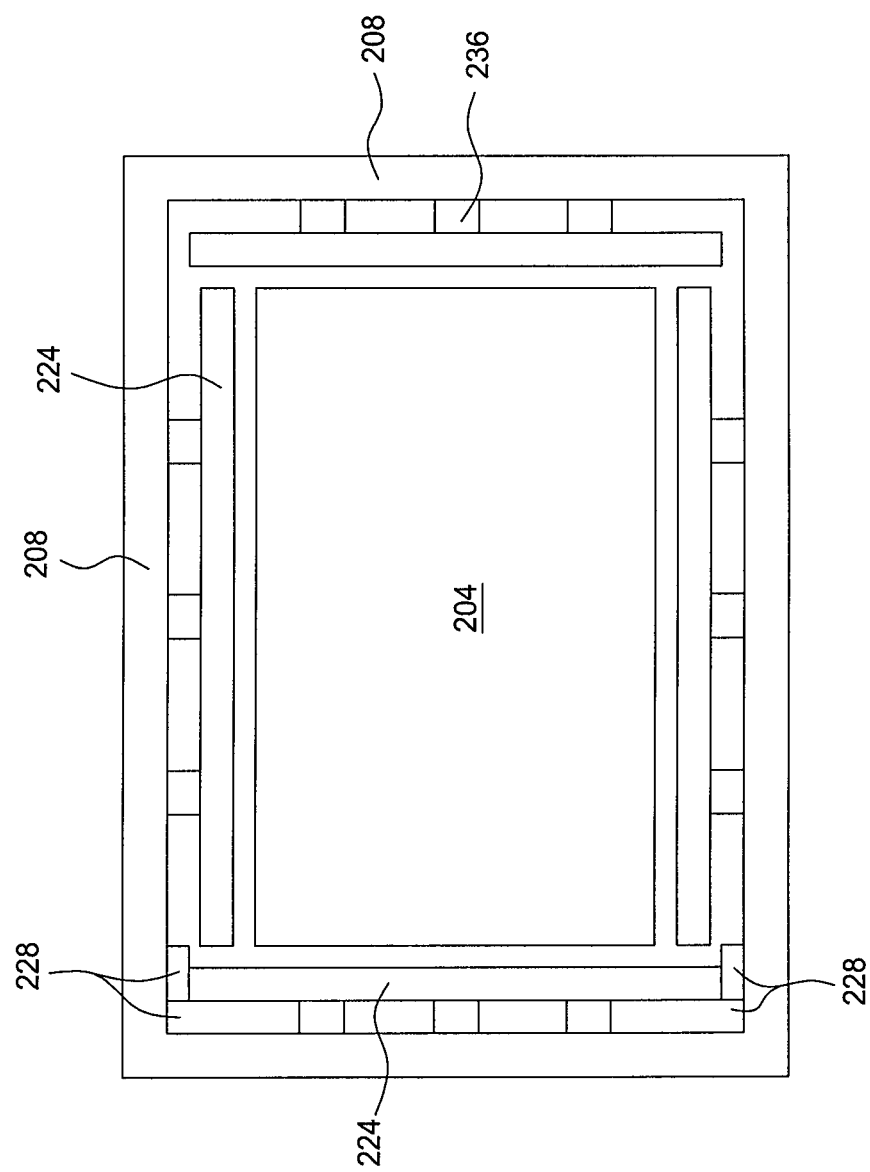
FIG. 2C is a schematic top view of the PECVD apparatus of FIG. 2A.
Figure 2D:
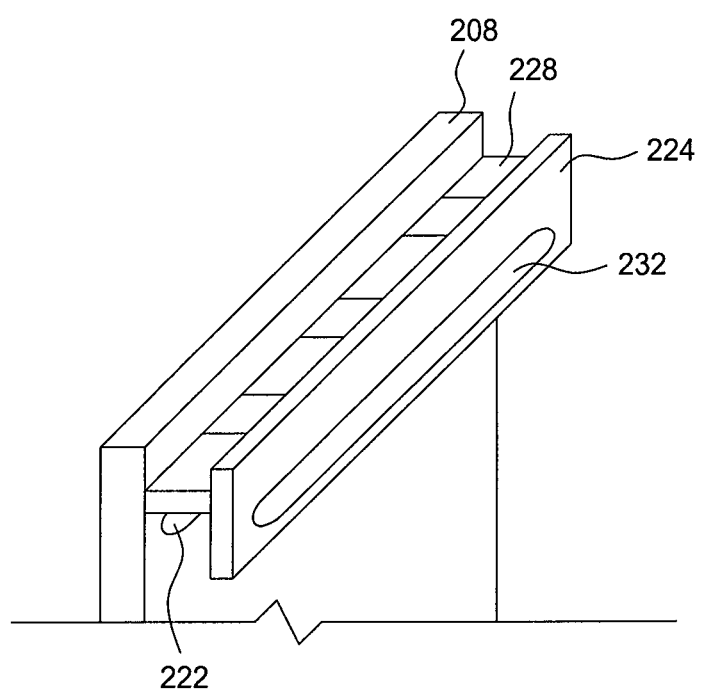
FIG. 2D is a schematic view of a flow guider and flow blocker of FIG. 2A.

In order to permit substrates to enter and exit the apparatus 200, the flow guider 224 disposed adjacent the slit valve opening 222 may have an opening 232 (See FIG. 2D). The opening 232 in the flow guider 224 may permit processing gases and plasma to deposit on the slit valve opening 222. To reduce the amount of processing gases and plasma that may reach the slit valve opening 222, a slit valve liner 226 or door may be disposed between the opening leading to the slit valve opening 222 and the flow blocker 224 having an opening 232. The slit valve liner 226 or door may be in the raised position (shown in FIG. 2A) whenever a substrate 206 is disposed within the processing chamber and the susceptor 204 is raised into the processing position. Similarly, the slit valve liner 226 or door may be lowered to permit insertion and removal of a substrate 206 from the processing chamber when the susceptor 204 is in the lowered position.

FIG. 2B is a schematic cross sectional view of the PECVD apparatus 200 of FIG. 2A with the susceptor 204 and slit valve liner 226 lowered. The slit valve liner 226 or door and the susceptor 204 may be coupled to an actuator 230 that controls the raising and lowering of both the susceptor 204 and the slit valve liner 226 or door. In one embodiment, the slit valve liner 226 or door and the susceptor 204 may be raised and lowered simultaneously. In another embodiment, the slit valve liner 226 or door and the susceptor 204 may be raised and lowered independently. In another embodiment, the slit valve liner 226 or door and the susceptor 204 may be coupled together. In another embodiment, the slit valve liner 226 or door and the susceptor 204 may each be coupled to a separate actuator 230.

FIG. 2C is a schematic top view of the PECVD apparatus 200 of FIG. 2A. The apparatus 200 has a plurality of chamber walls 208 with a flow guider 224 coupled with each wall 208. One or more mounts 236 may couple the flow guiders 224 to the chamber walls 208. The flow guiders 224 may be disposed between the chamber walls 208 and the susceptor 204. Additionally, the one or more flow blockers 228 may be disposed between the chamber wall 208 and the flow guider 224 adjacent the slit valve 222. One or more additional flow blockers 228 may be coupled with the walls 208 that are adjacent the wall 208 having the slit valve 208 disposed therein.

The flow blockers 228 may be disposed within the chamber to disrupt the flow of plasma and processing gas towards the slit valve opening 222. The flow blockers 228 may reduce the amount of processing gas and plasma that may flow between the chamber wall 208 corresponding to the slit valve opening 222 and the flow guider 224 corresponding to the slit valve opening 222. Flow blockers 228 may be disposed on adjacent walls 208 to the wall 208 having the slit valve opening 222 to assist in reducing the amount of processing gas and plasma that may reach the slit valve opening 222. Thus, the flow blockers 228 direct the flow of processing gas and plasma around the slit valve opening 222 during evacuation and processing. In one embodiment, the one or more flow blockers 228 comprise a single piece that spans the length of the sidewall. In another embodiment, the one or more flow blockers 228 comprise a plurality of pieces.

FIG. 2D is a schematic view of a flow guider 224 and flow blocker 228 of FIG. 2A. FIG. 2D shows the flow blocker 228 coupled with the chamber wall 208 and the flow guider 224. The flow guider 224 is spaced from the slit valve opening 222 by a distance substantially equal to the width of the flow blocker. In order to reduce the amount of processing gas and plasma that reaches the slit valve opening 222 and hence, the slit valve, the slit valve liner 226 or door may be raised into a position between the chamber wall 208 and the flow guider 224 so that no line of sight path between the opening 232 in the flow guider 224 and the opening 234 to the slit valve 222 exists. By blocking the line of sight path between the opening 232 in the flow guider 224 and the slit valve opening 222, the processing gas and the plasma may have to flow in a convoluted path and thus, may not reach the slit valve opening 222 or the chamber wall 208.

Figure 3A:
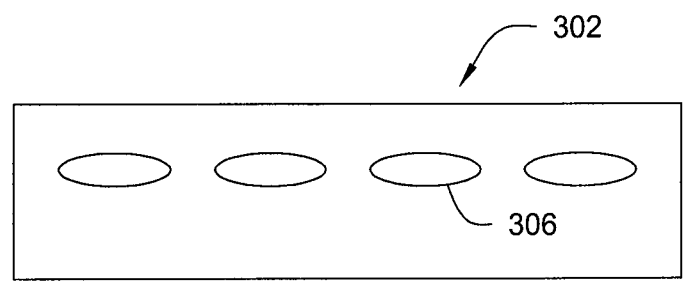
FIG. 3A is a schematic view of a flow guider according to one embodiment of the invention.
Figure 3B:
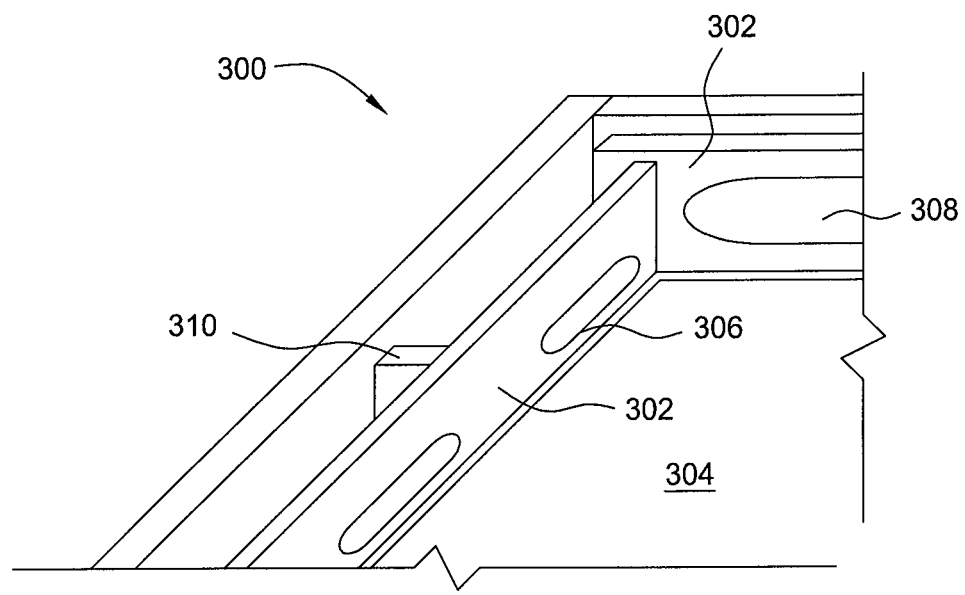
FIG. 3B is a schematic view of an apparatus having the flow guider of FIG. 3A.

FIG. 3A is a schematic view of a flow guider 302 according to one embodiment of the invention. FIG. 3B is a schematic view of an apparatus 300 having the flow guider 302 of FIG. 3A. The flow guider 302 may have one or more openings 306. The openings 306 may be used for coupling with the mountings 310 or for coupling the processing area with the vacuum pump. As may be seen from FIG. 3B, a gap may be present between the susceptor 304 and the flow guiders 302. Additionally, the flow guider 302 disposed adjacent the slit valve may have an opening 308 to permit insertion and removal of a substrate.

FIG. 4A is a partial sectional view of a door assembly 400 for blocking a slit valve opening 408 according to one embodiment of the invention. A door 412 is disposed between the sidewall 402 and the flow guider 404 and may be vertically actuated by a controller 414 as shown by arrows "F". The door 412 may be moved up to block the slit valve opening 408. The door 412 may be actuated vertically such that the door 412 is adjacent to the flow blocker 406 during processing and across from the opening 410 in the flow guider 404. In one embodiment, the flow blocker 406 is not present.

FIG. 4B is a partial sectional view of a door assembly 420 for blocking a slit valve opening 424 according to another embodiment of the invention. The door 426 may be coupled to a hinge assembly 430 that permits the door 426 to pivot (as controlled by a controller 428) in front of the slit valve opening 424 in the wall 422. The door 426 may be coupled with the wall 422 at a location below the slit valve opening 424. In one embodiment, the flow blocker 432 is not present.

FIG. 4C is a partial sectional view of a door assembly 440 for blocking a slit valve opening 450 in a wall 442 according to another embodiment of the invention. The door 448 may be coupled to a hinge assembly 450 disposed below the slit valve opening 450 and coupled to the wall 442. The door 448 may pivot about the hinge assembly 450 when controlled by the controller 452. In one embodiment, the flow blocker 444 is not present.

The flow guiders and flow blockers may be coupled with each other and the chamber wall by conventional coupling means. In one embodiment, the flow guiders and the flow blockers comprise aluminum. In another embodiment, the flow guiders and the flow blockers comprise anodized aluminum. In another embodiment, the flow guiders and the flow blockers comprise stainless steel. In one embodiment, the flow blockers may comprise a unitary piece of material. In another embodiment, the flow blockers and the flow guider adjacent the slit valve may comprise a unitary piece of material.

By utilizing flow guiders, flow blockers, and slit valve liners, undesirable deposition on chamber walls and the slit valve may be reduced. By reducing undesirable deposition, processing chambers may need less cleaning and therefore, have less downtime. Reducing processing chamber downtime may increase substrate throughput.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
   a chamber body having a slit valve opening through a first sidewall;
   one or more flow guiders mounted to one or more sidewalls of the chamber body, the one or more of the flow guiders having an opening therethrough that substantially aligns with the slit valve opening;
   one or more flow blockers mounted to and extending from the first sidewall above the slit valve opening, wherein the one or more flow guiders are mounted to the one or more flow blockers; and
   a door movable between a position covering the slit valve opening and a second position.

2. The apparatus of claim 1, wherein the door is pivotably coupled with the first sidewall.

3. The apparatus of claim 1, wherein the door is movable in a vertical plane.

4. The apparatus of claim 1, wherein the one or more flow blockers span a length that extends across the entire slit valve opening.

5. The apparatus of claim 1, further comprising a susceptor and an electrode spaced therefrom, wherein the one or more flow guiders, the susceptor, and the electrode enclose a processing area.

6. The apparatus of claim 5, wherein the electrode is a gas distribution showerhead.

7. The apparatus of claim 1, wherein the flow guiders on adjacent sidewalls are spaced apart.

8. An apparatus, comprising:
   a plurality of flow guiders extending from processing chamber walls to enclose a processing area between a susceptor and a gas distribution showerhead, a first of the plurality of flow guiders having an opening therethrough to permit a substrate to pass therethrough;
   one or more flow blockers mounted to the first flow guider and mounted to the chamber walls, extending away from the processing area; and
   one or more doors movable from a position blocking the opening to a position clear of the opening, the first flow guider disposed between the one or more doors and the processing area.

9. The apparatus of claim 8, wherein the door is pivotably coupled with the first sidewall.

10. The apparatus of claim 8, wherein the door is movable in a vertical plane.

11. The apparatus of claim 8, wherein the one or more flow blockers span a length that extends across the entire opening.

12. An apparatus, comprising:
    a chamber body having a plurality of sidewalls with an opening formed through a first sidewall;
    a flow guider mounted to the first sidewall, the flow guider having an opening therethrough that is substantially aligned with the opening in the first sidewall;
    a flow blocker mounted between the first sidewall and the flow guider over a slit valve opening, the flow blocker spanning a length greater than the slit valve opening; and
    a susceptor disposed in the chamber body such that an outer surface of the flow guider is aligned with a side of the susceptor.

13. The apparatus of claim 12, wherein the susceptor and the flow guider are spaced apart.

14. The apparatus of claim 12, further comprising a plurality of flow guiders mounted to a plurality of sidewalls of the chamber body.

15. The apparatus of claim 14, wherein the flow guiders on adjacent sidewalls are spaced apart.

16. The apparatus of claim 12, further comprising a door disposed within the chamber body and movable between a position blocking the slit valve opening and a position clear of the slit valve opening.

17. The apparatus of claim 16, wherein the door is pivotably coupled to the first sidewall.

18. The apparatus of claim 16, wherein the door is movable in a vertical plane.

19. The apparatus of claim 12, further comprising a gas distribution showerhead spaced from the susceptor and the flow guider.

20. The apparatus of claim 12, wherein the flow guider is coupled to ground.

* * * * *